United States Patent
Ogawa et al.

(10) Patent No.: US 8,435,903 B2
(45) Date of Patent: May 7, 2013

(54) SEMICONDUCTOR SUBSTRATE SURFACE TREATMENT METHOD

(75) Inventors: Yoshihiro Ogawa, Yokkaichi (JP);
Shinsuke Kimura, Yokkaichi (JP);
Tatsuhiko Koide, Yokkaichi (JP);
Hisashi Okuchi, Yokohama (JP);
Hiroshi Tomita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 13/069,164

(22) Filed: Mar. 22, 2011

(65) Prior Publication Data
US 2011/0269313 A1 Nov. 3, 2011

(30) Foreign Application Priority Data

Apr. 28, 2010 (JP) .................................. 2010-103943

(51) Int. Cl.
*H01L 21/302* (2006.01)
*H01L 21/461* (2006.01)

(52) U.S. Cl.
USPC ........... 438/745; 438/747; 438/749; 438/753; 438/754; 438/756; 438/757

(58) Field of Classification Search .................... None
See application file for complete search history.

(56) References Cited

U.S. PATENT DOCUMENTS

| | | | | |
|---|---|---|---|---|
| 8,334,211 | B2 * | 12/2012 | Kewley | 438/696 |
| 2003/0216050 | A1 * | 11/2003 | Golz et al. | 438/698 |
| 2009/0305506 | A1 * | 12/2009 | Linz | 438/696 |
| 2009/0311874 | A1 | 12/2009 | Tomita et al. | |

FOREIGN PATENT DOCUMENTS

| | | |
|---|---|---|
| JP | 2006-145897 | 6/2006 |
| JP | 3866130 | 10/2006 |
| JP | 2006-303022 | 11/2006 |

OTHER PUBLICATIONS

Notification of Reasons for Rejection issued by the Korean Intellectual Property Office on Jun. 13, 2012, for Korean Patent Application No. 10-2011-19414, and English-language translation thereof.
Ogawa et al.; "Apparatus and Method of Treating Surface of Semiconductor Substrate", U.S. Appl. No. 12/886,427, filed Sep. 2010.
Okuchi et al.; "Apparatus and Method of Treating Surface of Semiconductor Substrate", U.S. Appl. No. 12/879,097, filed Sep. 10, 2010.
Koide et al.; "Surface Treatment Apparatus and Method for Semiconductor Substrate", U.S. Appl. No. 12/887,332, filed Sep. 2010.

* cited by examiner

*Primary Examiner* — Duy Deo
(74) *Attorney, Agent, or Firm* — Finnegan, Henderson, Farabow, Garrett & Dunner, L.L.P.

(57) ABSTRACT

In one embodiment, a method for treating a surface of a semiconductor substrate is disclosed. The semiconductor substrate has a first pattern covered by a resist and a second pattern not covered by the resist. The method includes supplying a resist-insoluble first chemical solution onto a semiconductor substrate to subject the second pattern to a chemical solution process. The method includes supplying a mixed liquid of a water repellency agent and a resist-soluble second chemical solution onto the semiconductor substrate after the supply of the first chemical solution, to form a water-repellent protective film on a surface of at least the second pattern and to release the resist. In addition, the method can rinse the semiconductor substrate using water after the formation of the water-repellent protective film, and dry the rinsed semiconductor substrate.

20 Claims, 8 Drawing Sheets

PRESENCE OF PATTERN FALLING

FIG.8B

PRESENCE OF PATTERN FALLING

FIG.8C

ABSENCE OF PATTERN FALLING

SEMICONDUCTOR SUBSTRATE SURFACE TREATMENT METHOD

CROSS REFERENCE TO RELATED APPLICATIONS

This application is based upon and claims the benefit of priority from the prior Japanese Patent Application No. 2010-103943, filed on Apr. 28, 2010, the entire contents of which are incorporated herein by reference.

FIELD

Embodiments described herein relate generally to a semiconductor substrate surface treatment method.

BACKGROUND

In recent years, with finer semiconductor devices, methods for forming patterns having a dimension less than the exposure resolution limit of lithography have been desired. As one of such methods, there has been known a method for forming side wall patterns on the side surfaces of a dummy pattern (core) and using the side wall patterns as a mask to perform the etching of a film to be processed. The dummy pattern between the side wall patterns is removed by a wet process. There has been the problem that the side wall patterns are fallen due to the surface tension of a chemical solution (or pure water) entering between the side wall patterns at the time of a drying process after the wet process. There has been known a method for preventing the falling of patterns by substituting the pure water on a wafer with IPA (isopropyl alcohol) having smaller surface tension than the pure water to dry the substrate. However, even with the IPA, it is difficult to prevent the falling of the fine patterns formed by the above method.

In addition, typically, a plurality of patterns are present on one chip, and resist patterning and an etching process, such as wet etching and dry etching, are performed to produce different types of patterns. After pattern etching is performed in a region being not covered by a resist, an ashing and/or SPM (Sulfuric Acid Hydrogen Peroxide Mixture) process is performed for releasing the resist. However, such method has the problem that the number of steps is large, resulting in increased manufacturing cost. In addition, when the resist is released by the wet process to dry the substrate, the fine patterns can be fallen.

DETAILED DESCRIPTION

In one embodiment, a method for treating a surface of a semiconductor substrate is disclosed. The semiconductor substrate has a first pattern covered by a resist and a second pattern not covered by the resist. The method includes supplying a resist-insoluble first chemical solution onto a semiconductor substrate to subject the second pattern to a chemical solution process. The method includes supplying a mixed liquid of a water repellency agent and a resist-soluble second chemical solution onto the semiconductor substrate after the supply of the first chemical solution, to form a water-repellent protective film on a surface of at least the second pattern and to release the resist. In addition, the method can rinse the semiconductor substrate using water after the formation of the water-repellent protective film, and dry the rinsed semiconductor substrate.

Hereafter, an embodiment of the present invention will be described with reference to the drawings.

Figure 1:
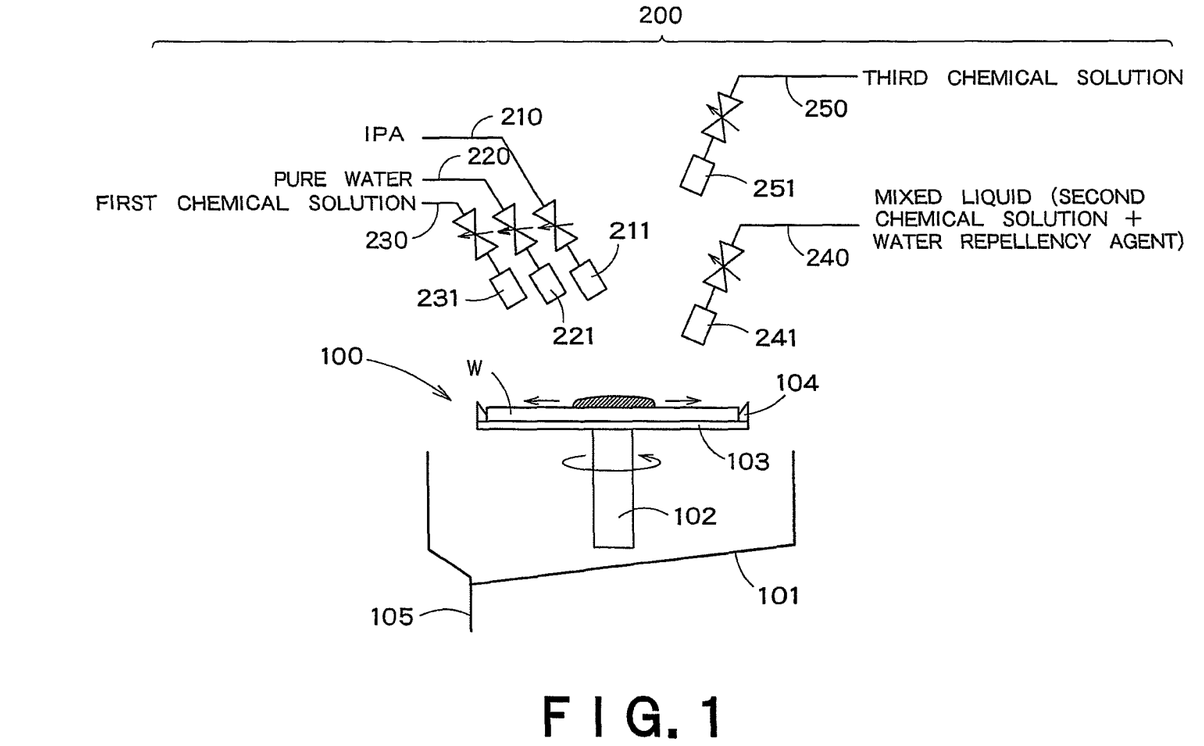
FIG. 1 is a schematic configuration diagram of a semiconductor substrate surface treatment apparatus according to an embodiment of the present invention.

FIG. 1 shows the schematic configuration of a semiconductor substrate surface treatment apparatus according to an embodiment of the present invention. The surface treatment apparatus has a substrate holding and rotating unit 100 and a chemical solution supplying unit 200.

The substrate holding and rotating unit 100 has a spin cup 101 configuring a processing chamber, a rotational shaft 102, a spin base 103, and a chuck pin 104. The rotational shaft 102 is extended in the substantially vertical direction, and has an upper end to which a disc-like spin base 103 is attached. The rotational shaft 102 and the spin base 103 can be rotated by a motor, which is not shown.

The chuck pin 104 is provided at a circumferential edge of the spin base 103. The chuck pin 104 grips a substrate (wafer) W, so that the substrate holding and rotating unit 100 can substantially horizontally hold and rotate the substrate W.

When a liquid is supplied from the chemical solution supplying unit 200 to near the rotation center on the surface of the substrate W, the liquid is spread in the radius direction of the substrate W. In addition, the substrate holding and rotating unit 100 can perform spin drying of the substrate W. The excessive liquid splashed in the radius direction of the substrate W is trapped by the spin cup 101, and is discharged via a liquid discharge pipe 105.

The chemical solution supplying unit 200 can supply IPA, pure water, a first chemical solution, a mixed liquid of a second chemical solution and a water repellency agent, a third chemical solution, and the like onto the surface of the substrate W.

The IPA is supplied via a supply line 210 and is discharged from a nozzle 211.

Likewise, the pure water is supplied via a supply line 220 and is discharged from a nozzle 221.

The first chemical solution is supplied via a supply line 230 and is discharged from a nozzle 231. The first chemical solution is a resist-insoluble chemical solution, e.g., BHF (buffered hydrofluoric acid), HF (hydrofluoric acid), and $H_3PO_4$ (phosphoric acid). Further, it is desirable that the first chemical solution is hard to permeate through the interface between the resist and the pattern.

The mixed liquid of the second chemical solution and the water repellency agent is supplied via a supply line 240 and is discharged from a nozzle 241. The second chemical solution is a resist-soluble chemical solution (a solvent which permeates through an organic material) and is thinner such as propylene glycol monomethyl ether acetate (PGMEA). The water repellency agent is a chemical solution which forms a water-repellent protective film on the surface of a convex shaped pattern formed on the surface of the substrate W to make the pattern surface water-repellent, e.g., a silane coupling agent. The silane coupling agent has, in molecules, hydrolyzable groups having affinity and reactivity with an inorganic material, and organic functional groups which are chemically bonded to an organic material. For example, hexamethyldisilazane (HMDS) and tetramethyl silyl diethylamine (TMSDEA) can be used as the silane coupling agent. The water repelling of the convex shaped pattern surface will be described later. The second chemical solution and the water repellency agent may be mixed near the nozzle 241 by a mixing valve, which is not shown.

The third chemical solution is supplied via a supply line 250 and is discharged from a nozzle 251. The third chemical solution is a chemical solution which is resist-insoluble or has low resist solubility, and is, e.g., an oxidizing agent such as SC1 (ammonia hydrogen peroxide mixture), SC2 (hydrochloric acid hydrogen peroxide mixture), sulfuric acid, $H_2O_2$ (hydrogen peroxide) water solution, and $O_3$ (ozone) gas dissolving water. When the convex shaped pattern formed on the surface of the substrate W is a silicon film, the third chemical solution can oxidize the convex shaped pattern surface.

Further, typically, as the chemical solution has higher oxidizability, the resist dissolving speed and the permeation amount into the interface between the resist and the pattern tend to be increased. An oxidizing agent such as $H_2O_2$ and $O_3$ following surfactant added BHF which can suppress the erosion of the resist due to the third chemical solution may be continuously supplied.

In addition, the surface treatment apparatus has an excimer UV (ultraviolet) emitting unit, which is not shown. The excimer UV emitting unit can emit UV light onto the semiconductor substrate W, leave the convex shaped pattern, and remove the water-repellent protective film. A removing unit which leaves the convex shaped pattern to remove the water-repellent protective film by a method other than ultraviolet emission may be provided.

Figure 2:
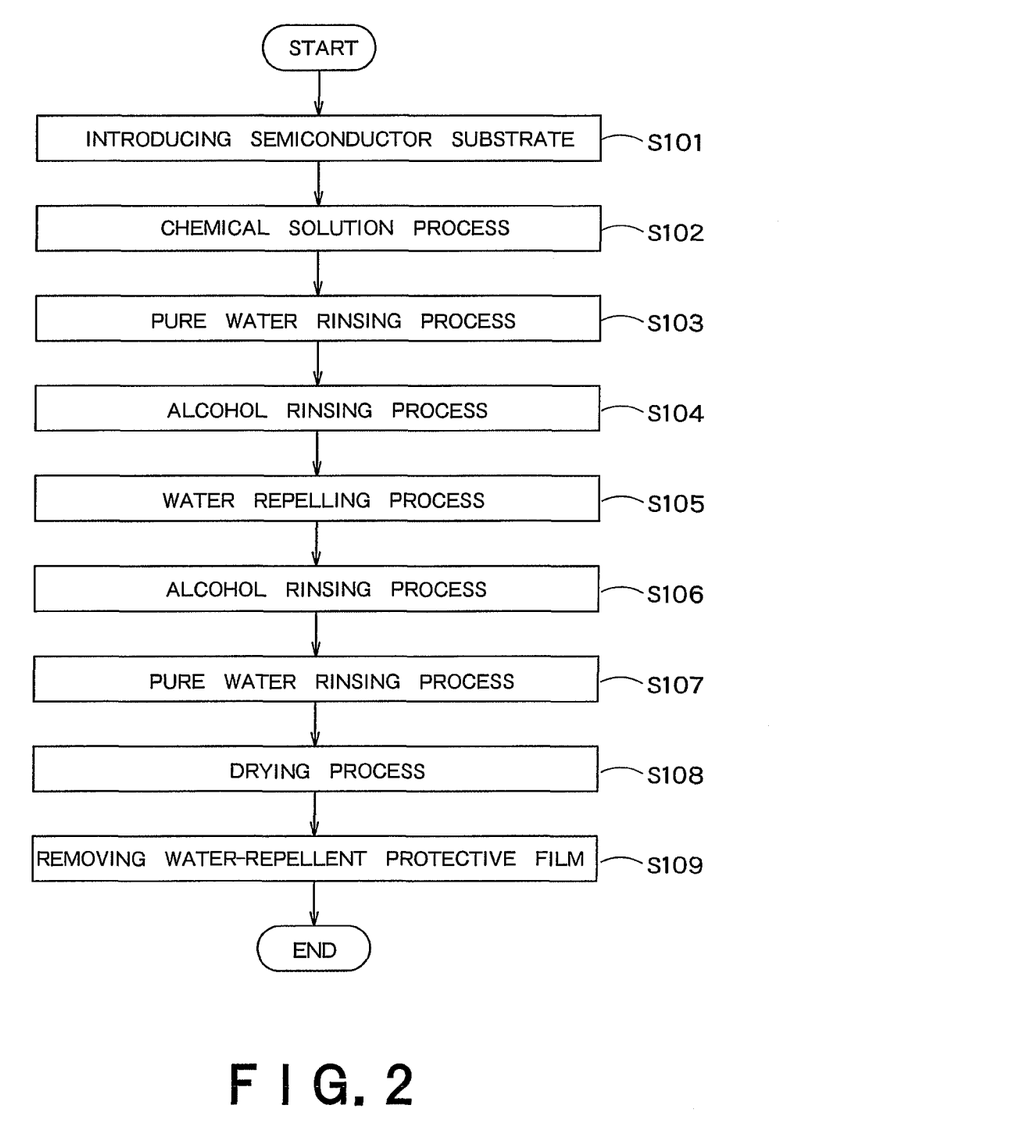
FIG. 2 is a flowchart of assistance in explaining a semiconductor substrate surface treatment method according to the embodiment.

A method for performing a semiconductor substrate surface treatment using such surface treatment apparatus will be described with reference to a flowchart shown in FIG. 2. Further, the operation of the substrate holding and rotating unit 100 and the chemical solution supplying unit 200 can be controlled by a controlling unit, which is not shown.

(Step S101) The semiconductor substrate W to be processed, which has a plurality of types of convex shaped patterns in a predetermined region on the surface, is conveyed by a conveying unit (not shown), and is held by the substrate holding and rotating unit 100. The convex shaped pattern is, e.g., a line and space pattern. The convex shaped pattern is formed by, e.g., an RIE (Reactive Ion Etching) method. In addition, by resist patterning, the convex shaped pattern covered by the resist and the convex shaped pattern not covered by the resist are mixed. At least part of the convex shaped pattern may be formed of a film including silicon.

(Step S102) The semiconductor substrate W is rotated at a predetermined rotational speed to supply the first chemical solution from the chemical solution supplying unit 200 to near the rotation center on the surface of the semiconductor substrate W. The first chemical solution is spread over the entire surface of the semiconductor substrate W due to centrifugal force caused by the rotation of the semiconductor substrate W to perform a chemical solution process (e.g., cleaning process) of the semiconductor substrate W. Since the first chemical solution is a resist-insoluble chemical solution, the resist is not removed.

(Step S103) The pure water is supplied from the chemical solution supplying unit 200 to near the rotation center on the surface of the semiconductor substrate W. The pure water is spread over the entire surface of the semiconductor substrate W due to centrifugal force caused by the rotation of the semiconductor substrate W. Thereby, a pure water rinsing process in which the first chemical solution left on the surface of the semiconductor substrate W is rinsed by the pure water is performed.

(Step S104) Alcohol such as the IPA is supplied from the chemical solution supplying unit 200 to near the rotation center on the surface of the semiconductor substrate W. The IPA is spread over the entire surface of the semiconductor substrate W due to centrifugal force caused by the rotation of the semiconductor substrate W. Thereby, an alcohol rinsing process which substitutes the pure water left on the surface of the semiconductor substrate W with the IPA is performed.

(Step S105) The mixed liquid (the second chemical solution plus the water repellency agent) is supplied from the chemical solution supplying unit 200 to near the rotation center on the surface of the semiconductor substrate W. The mixed liquid is spread over the entire surface of the semiconductor substrate W due to centrifugal force caused by the rotation of the semiconductor substrate W. Since the second chemical solution in the mixed liquid is a resist-soluble chemical solution, the resist on the semiconductor substrate W is removed. In addition, the protective film having low wettability (water-repellent protective film) is formed on the surface of the convex shaped pattern by the water repellency agent in the mixed liquid.

The water-repellent protective film is formed by the occurrence of the ester reaction of the silane coupling agent. Therefore, the reaction may be promoted by performing an annealing process to increase the liquid temperature or by emitting ultraviolet light from the excimer UV emitting unit.

When the convex shaped pattern is a silicon nitride film or a silicon film made of polysilicon and the like, silylation reaction is insufficient even when a silylation process using the silane coupling agent is performed, with the result that sufficient water repellency cannot be obtained. In that case, preferably, the chemical solution process using the third chemical solution supplied from the chemical solution supplying unit 200 is added to step S102 to change the surface of the silicon material to a chemical oxide film made of a silicon oxide. Thereafter, the silylation process is performed so that the water repellency after the silylation process can be improved.

Figure 3:
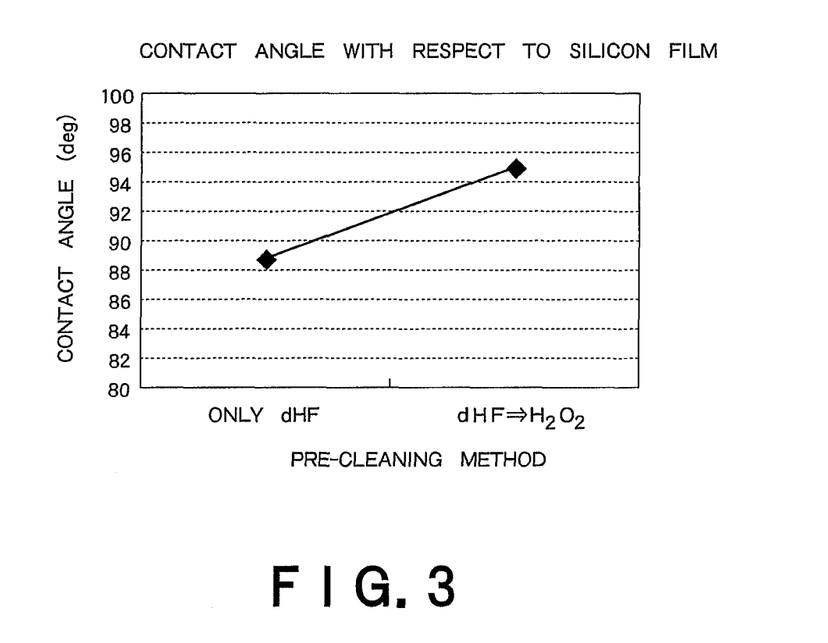
FIG. 3 is a graph showing the relation between a cleaning sequence and the contact angle of water with respect to a pattern.

For instance, when the convex shaped pattern is a silicon film, as shown in FIG. 3, only a dHF (dilute hydrofluoric acid) process is performed to form the water-repellent protective film. The contact angle of water with respect to the pattern is 89 degrees. When an $H_2O_2$ process is added to this, the contact angle is improved to 95 degrees. It is considered that this is because the moderate oxide film is formed on the surface of the silicon film, the water-repellent protective film is easily formed.

In addition, a large amount of processing residuals is left after the RIE (Reactive Ion Etching) process. The water-repellent protective film is hard to be formed in the state that the processing residuals are left. Therefore, the removal of the residuals by performing the chemical solution process using the first chemical solution in step S102 is effective for forming the water-repellent protective film. Further, plasma damages are accumulated on the pattern surface by the RIE process, thereby causing dangling bond. With a modification process using a chemical solution having oxidative effect, the dangling bond is modified by OH groups. When a large number of OH groups are present, the silylation reaction probability is increased and the water-repellent protective film is easily formed. Accordingly, higher water-repellent degree can be obtained. In this example, when the fine pattern is a silicon oxide film, the effect can be obtained.

Further, in the above description, the example in which, after the cleaning of the semiconductor substrate W, the surface of the semiconductor substrate W is property-modified by the processing chemical solution (the third chemical solution) different from the cleaning chemical solution (the first chemical solution) has been shown. However, when the cleaning chemical solution also provides the modification effect, that is, has the oxidative effect, the property modification process is not required to be additionally performed.

(Step S106) The IPA is supplied from the chemical solution supplying unit 200 to near the rotation center on the surface of the semiconductor substrate W. The IPA is spread over the entire surface of the semiconductor substrate W due to centrifugal force caused by the rotation of the semiconductor substrate W. Thereby, an alcohol rinsing process which substitutes the second chemical solution and the unreacted silane coupling agent left on the surface of the semiconductor substrate W with the IPA is performed.

(Step S107) The pure water is supplied from the chemical solution supplying unit 200 to near the rotation center on the surface of the semiconductor substrate W. The pure water is spread over the entire surface of the semiconductor substrate W due to centrifugal force caused by the rotation of the semiconductor substrate W. Thereby, a pure water rinsing process in which the IPA left on the surface of the semiconductor substrate W is rinsed by the pure water is performed.

(Step S108) The drying process of the semiconductor substrate W is performed. For instance, a spin drying process which increases the rotational speed of the semiconductor substrate W to a predetermined spin dry rotational speed to shake off the pure water left on the surface of the semiconductor substrate W and dry the semiconductor substrate W is performed.

Figure 4:
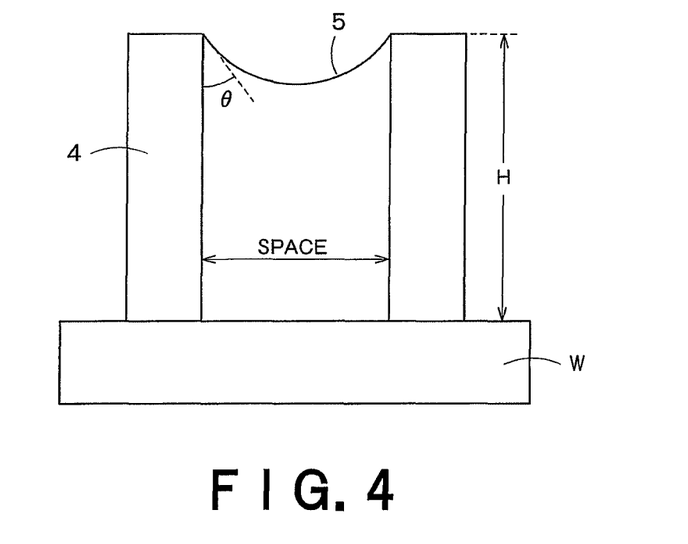
FIG. 4 is a diagram of assistance in explaining the surface tension of a liquid applied onto the pattern.

Since the convex shaped pattern formed on the semiconductor substrate W is covered by the water-repellent protective film, the contact angle θ of the liquid is increased. FIG. 4 shows the state where part of a pattern 4 formed on the semiconductor substrate W is wet with a liquid 5. Here, when the distance between the patterns 4 is denoted by Space, the height of the pattern 4 is denoted by H, and the surface tension of the liquid 5 is denoted by γ, a force P applied to the pattern 4 is represented as follows:

$$P = 2 \times \gamma \times \cos\theta \cdot H / \text{Space} \qquad \text{(Equation 1)}$$

It is found that when θ approaches 90°, cos θ approaches 0 and the force P acting on the pattern at the time of the drying process is reduced. Thereby, the pattern can be prevented from being fallen at the time of the drying process.

(Step S109) The ultraviolet is emitted from the excimer UV emitting unit to remove the water-repellent protective film formed on the convex shaped pattern surface. In the present embodiment, since the surface of the semiconductor substrate W is cleaned and dried, the removal of the water-repellent protective film is performed to complete the cleaning step. When the water-repellent protective film is removed in the step after the cleaning step, the water-repellent protective film is not required to be removed immediately after drying.

In this way, in the present embodiment, when the surface of the semiconductor substrate W provided with the resist pattern is cleaned, the forming of the water-repellent protective film on the surface of the substrate and the release of the resist are performed at the same time (in the same step). Therefore, the convex shaped fine pattern falling at the time of the drying process can be prevented. Furthermore, since the resist release step is not required to be added, the manufacturing cost can be reduced. According to the above embodiment, pattern falling can be prevented without largely increasing the number of manufacturing steps.

To prevent the falling of the pattern formed on the substrate, the force (P expressed in Equation 1) applied to the pattern is required to be reduced. Among the parameters in Equation 1, the Space is a fixed parameter determined by the pattern dimension, and the wettability cos θ is a fixed parameter determined by the relation between a substance configuring (the surface of) the fine pattern and the liquid. The conventional substrate treatment focuses on the surface tension γ to reduce the force applied to the pattern using the liquid with a small γ. However, γ can be lowered to a limited extent, with the result that pattern falling cannot be prevented.

On the contrary, as described above, in the surface treatment method according to the present embodiment, the water-repellent protective film is formed on the pattern surface and the wettability cos θ is controlled so that the force applied to the pattern is reduced to a very low level at the time of drying, whereby pattern falling can be prevented.

The surface treatment method according to the above embodiment is particularly effective for preventing pattern falling when the aspect ratio is 8 or more.

In the above embodiment, the alcohol rinsing process is performed (steps S104 and S106) before and after the water-repellent protective film forming step (step S105). This is because the silane coupling agent used at the time of the forming of the water-repellent protective film can be hardly substituted with the pure water depending on types. Therefore, when the silane coupling agent used is a substance which can be substituted with the pure water, the alcohol rinsing process can be omitted.

In the above embodiment, when the silane coupling agent used as the water repellency agent causes hydrolysis by the hydroxyl groups in the IPA and the water-repellent ability can be lowered, the IPA on the semiconductor substrate may be substituted with thinner before the supply of the water repellency agency.

The surface treatment apparatus according to the above embodiment is preferably applied to the removal of the core, the cleaning and drying of the substrate when different types of patterns are produced in a side wall transfer process.

Figure 5A:
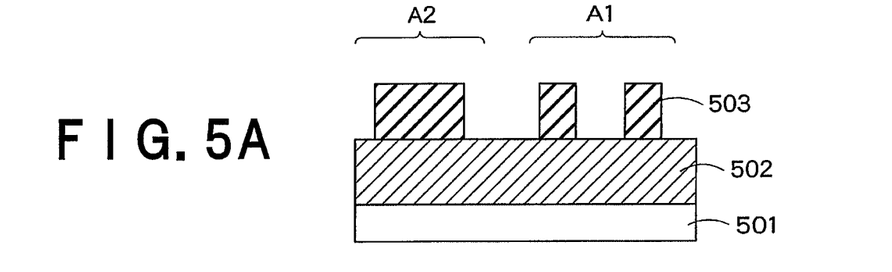
FIGS. 5A, 5B, 5C, and 5D are cross-sectional views of assistance in explaining a side wall transfer process.

As shown in FIG. 5A, in the side wall transfer process, at first, a second film 502 is formed on a first film 501 formed on the semiconductor substrate (not shown). The first film 501 is a gate material film or a hard mask on a process target. Then, a resist 503 having the line and space pattern is formed on the second film 502.

The first film 501 may be a film having a plurality of layers, e.g., a control gate electrode film, an insulating film between electrodes, and a charge storage film, which configure the stack gate configuration of a flash memory.

The second film 502 is made of C, $SiO_2$, SiN, and the like. Thickness of the second film 502 is determined based on the etching selective ratio of the first film 501 and a third film 505 formed in the later step.

The resist 503 is formed so as to have a fine pattern in which a region A1 has a smaller pitch than a region A2 in the semiconductor substrate. For instance, the region A1 corresponds to a memory cell section, and the region A2 corresponds to a peripheral circuit section.

Figure 5B:
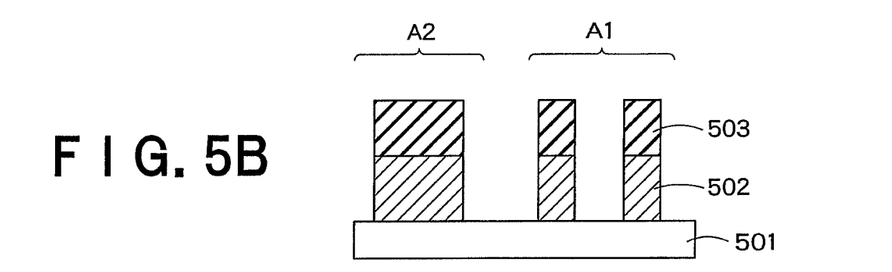

Next, as shown in FIG. 5B, with the resist 503 serving as a mask, the second film 502 is subjected to etching to transfer the pattern.

Figure 5C:
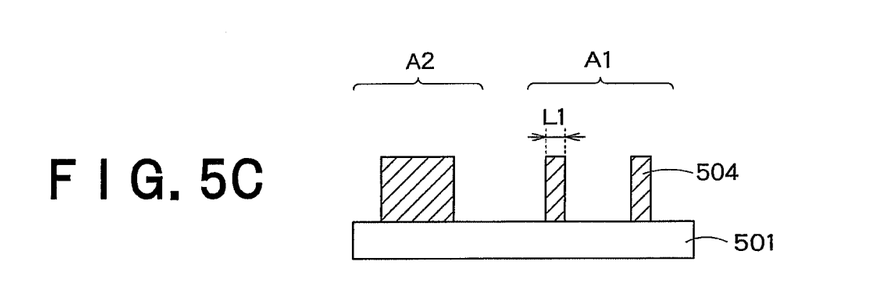

Next, as shown in FIG. 5C, the second film 502 is subjected to a slimming process, so that the second film 502 having a width reduced to about ½ in the region A1 is processed into a core 504. At this time, although the width of the second film 502 in the region A2 is also slightly reduced, the core 504 of the region A2 has a larger width than the core 504 of the region A1. The resist 503 is removed before or after the slimming process. The slimming process is performed by the wet process, the drying process, or a combination of the wet process and the drying process.

Figure 5D:
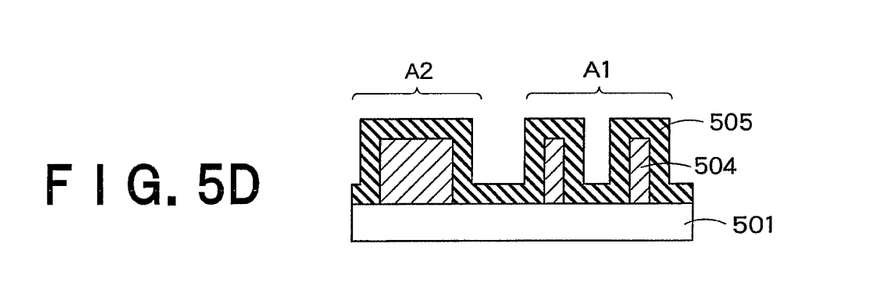

Next, as shown in FIG. 5D, the third film 505 is formed by a CVD (Chemical Vapor Deposition) method so as to cover the upper surface and the side surfaces of the core 504 at a constant film thickness. The third film 505 is formed of a material which allows a large etching selective ratio of the third film 505 to the core 504. For instance, when the core 504 is made of $SiO_2$, Si or SiN is used for the third film 505.

Figure 6A:
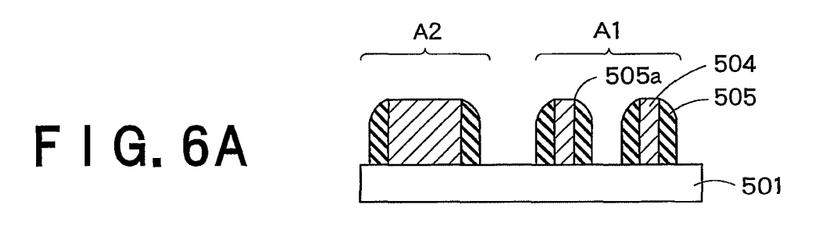
FIGS. 6A, 6B, 6C, 6D, and 6E are cross-sectional views of assistance in explaining a side wall transfer process.

Next, as shown in FIG. 6A, the third film 505 is dry etched until the upper surface of the core 504 is exposed. The dry etching is performed under the etching condition having selectivity with respect to the core 504. Thereby, the third film 505 remains in a spacer form along the side surfaces of the core 504. In the third film 505 remaining at this time has an upper end 505a located so as to be contacted with the upper portion of the side surfaces of the core 504, and is in a shape where an upper side portion has a convex curved shape toward the outside of the core 504.

Figure 6B:
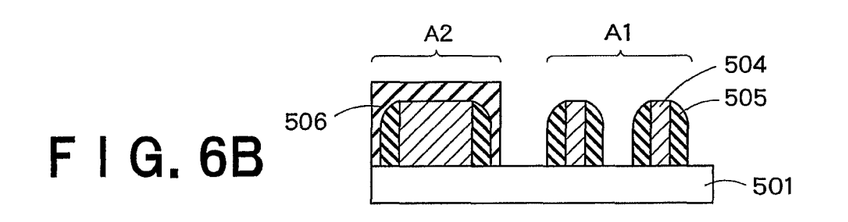

Next, to manufacture patterns having different pitches, as shown in FIG. 6B, a resist 506 is formed to cover the core 504 and the third film 505 in the region A2, and pattern processing is performed so as to expose the core 504 and the third film 505 in the region A1. The semiconductor substrate which has been subjected to this process is conveyed into the surface treatment apparatus according to the above embodiment, and the later steps are performed by the surface treatment apparatus.

Figure 6C:
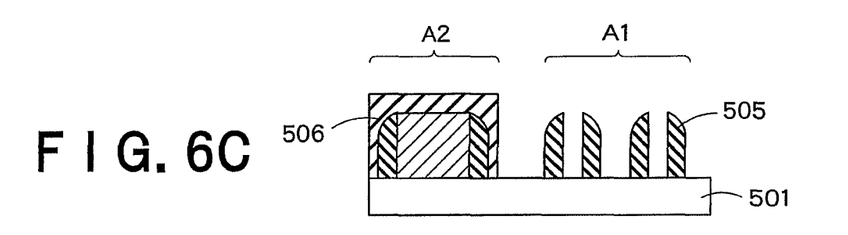

The chemical solution supplying unit 200 of the surface treatment apparatus supplies the first chemical solution and, as shown in FIG. 6C, the core 504 in the region A1 is removed by a wet etching process. The third film 505 has a non-symmetrical shape in which the distance (the opening width dimension of the space pattern) between the upper ends of two adjacent patterns is alternately short or long. Further, the chemical solution supplying unit 200 may supply the third chemical solution to oxidize the surface of the third film 505. At this time, the third film 505 has an aspect ratio of, e.g., 8 or more.

Figure 6D:
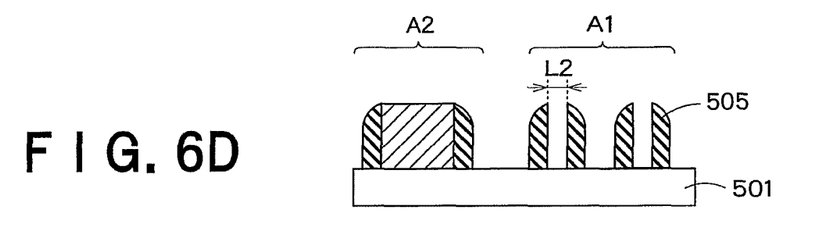

Next, the chemical solution supplying unit 200 supplies the mixed liquid of the second chemical solution and the water repellency agent, and as shown in FIG. 6D, the resist 506 is removed and the water-repellent protective film (not shown) is formed on the surface of the third film 505. Before and after the supply of the mixed liquid, the chemical solution supplying unit 200 may supply the IPA to perform the alcohol rinsing process.

Figure 6E:
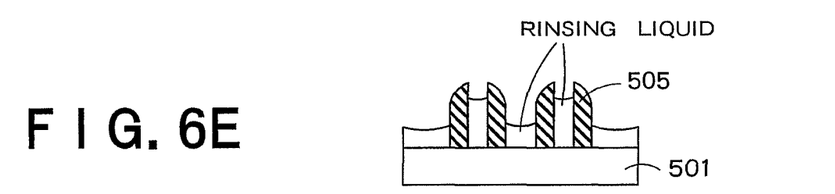

Next, the chemical solution supplying unit 200 supplies the pure water to clean the pattern, followed by the drying process. Here, when the pattern having a non-symmetrical shape like the third film 505 in the region A1 is cleaned and dried, as shown in FIG. 6E, the liquid surface lowering speed of the rinsing liquid in the space portion is largely different, with the result that a large force can be easily applied to the pattern. Accordingly, it is difficult to prevent pattern falling.

Further, with the pattern of the third film 505 obtained by removing the water-repellent protective film on the pattern surface as a mask, the first film 501 and the semiconductor substrate therebelow and the like as a substance to be processed is dry etched to transfer the pattern. Subsequently, reactive by-products due to dry etching are cleaned and removed. At this time, the third film 505 having the non-symmetrical shape in which the upper side portion is convex curved is used as a mask. Due to the influence of the non-symmetrical shape, variation in the opening width dimension of the space pattern remains in the transferred substance to be processed. For this reason, when the pattern of the substance to be processed is cleaned and dried, like the pattern of the third film 505, the liquid surface lowering speed of the rinsing liquid in the space portion is largely different, with the result that a large force can be easily applied to the pattern. Accordingly, it is difficult to prevent pattern falling.

However, with the surface treatment apparatus according to the above embodiment, in even the non-symmetrical pattern formed by the side wall transfer process, the water repelling process of the pattern surface is performed so that the substrate can be cleaned and dried while pattern falling is prevented. In addition, the formation of the water-repellent protective film and the release of the resist 506 formed to produce different types of patterns are performed at the same time, so that the number of steps and the manufacturing cost can be reduced.

Figure 7A:
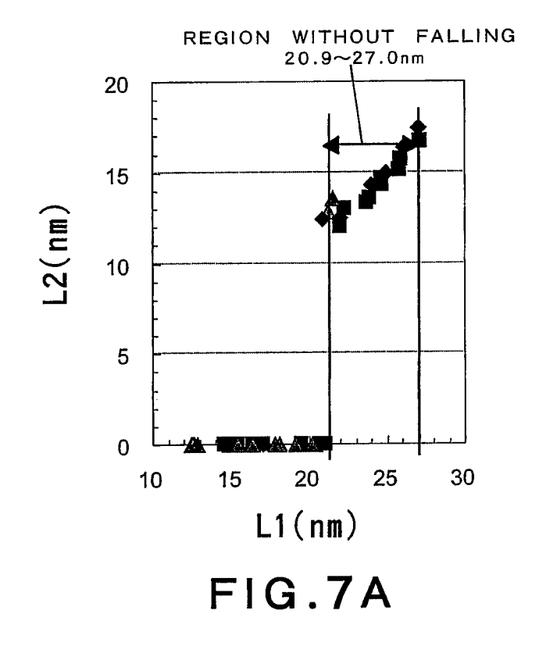
FIGS. 7A and 7B are graphs showing the relation between the dimension of a core and pattern falling.
Figure 7B:
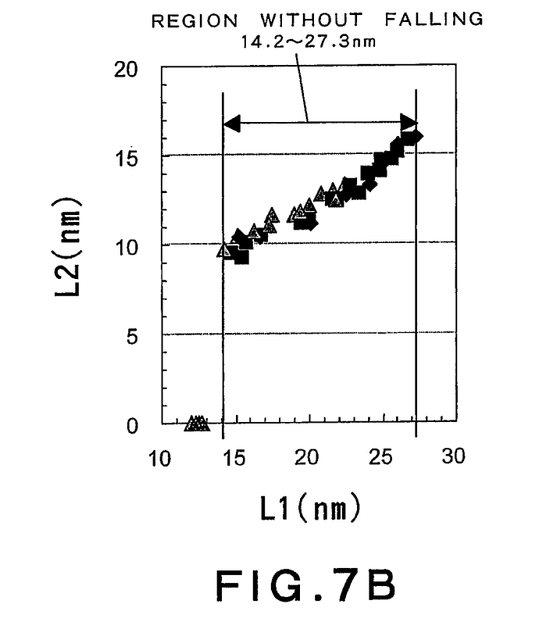

FIGS. 7A and 7B show examples of the relation between the dimension and the presence or absence of pattern falling when the water repelling process with respect to the surface of the side wall pattern formed by the side wall transfer process is performed and when it is not performed. The horizontal axis of the graph shows the dimension of the core after the slimming process, and corresponds to the L1 of FIG. 5C. The vertical axis of the graph shows the space dimension after the removal of the core (the dimension of the portion in which the core is originally present), and corresponds to the L2 of FIG. 6D.

FIG. 7A shows the result when the water repelling process is not performed, and FIG. 7B shows the result when the water repelling process is performed. From the graph of FIG. 7A, it is found that when the dimension L1 is less than 20.9 nm, the dimension L2 is 0, that is, pattern falling occurs. On the contrary, from the graph of FIG. 7B, it is found that in the range in which the dimension L1 is 14.2 nm or more, pattern falling does not occur. Therefore, it is found that pattern falling can be prevented in even finer pattern by performing the water repelling process of the pattern surface.

Figure 8A:
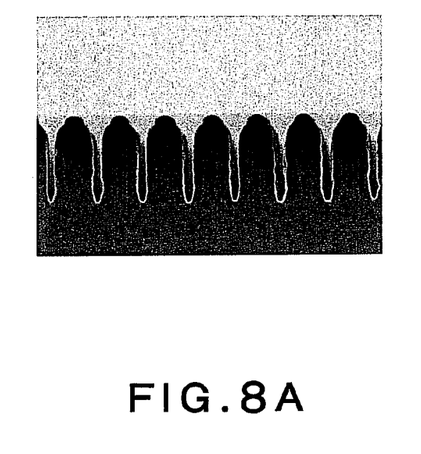
FIGS. 8A, 8B, 8C, and 8D are diagrams showing the cross sections of side wall patterns in the side wall transfer process.
Figure 8B:
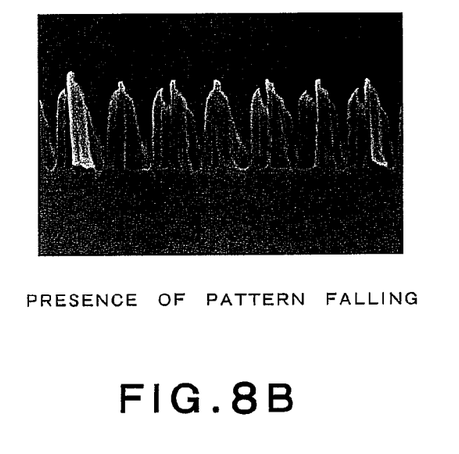
Figure 8C:
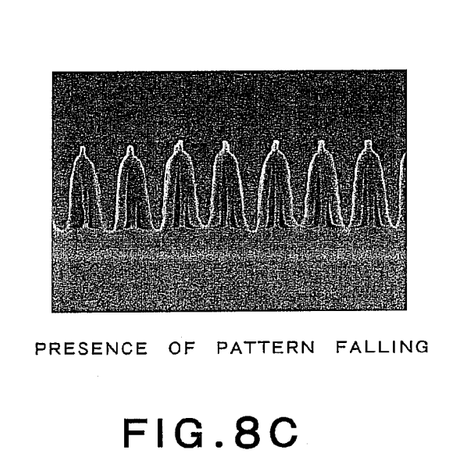

FIG. 8A shows the cross section of the patterns in which the material of the cores (cores 504) is TEOS and the material of the side walls (side wall patterns 505) is amorphous silicon. FIG. 8B shows the pattern cross section in which the patterns are subjected to the hydrofluoric acid process to remove the cores, followed by rinsing and drying of the substrate. In addition, FIG. 8C shows the pattern cross section in which the pattern surfaces are subjected to the hydrofluoric acid process and the ozone dissolving water process so as to be made hydrophilic, followed by rinsing and drying of the substrate. Further, FIG. 8D shows the pattern cross section in which the pattern surfaces are subjected to the hydrofluoric acid process, the $H_2O_2$ process, and the water repelling process so as to be made water-repellent, followed by rinsing and drying of the substrate.

Figure 8D:
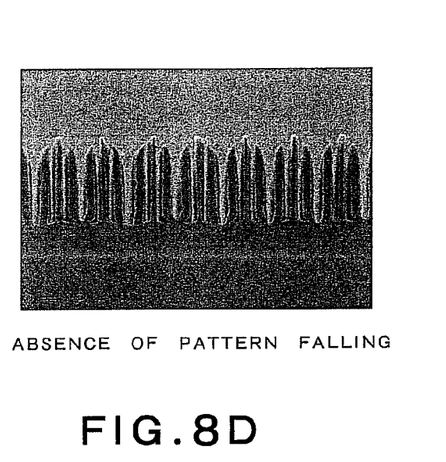

The pattern falling occurs in FIGS. 8B and 8C, while the pattern falling does not occur in FIG. 8D. As described above, it is found that the water-repellent protective film can be easily formed by the $H_2O_2$ process, so that fine pattern falling can be prevented.

Figure 9A:
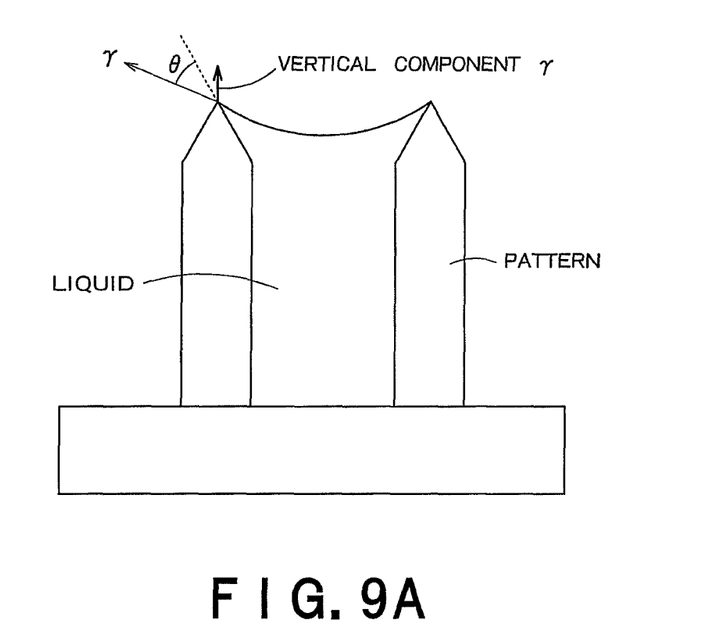
FIGS. 9A and 9B are diagrams of assistance in explaining the surface tension of a liquid applied onto the pattern.

As can be seen from Equation 1 and FIG. 4, the force P applied to the pattern 4 depends on the vertical component of the surface tension γ. Therefore, as shown in FIG. 9A, the upper portion of the pattern may be inclined to reduce the vertical component of the surface tension γ, so that the force applied to the pattern can be reduced.

Such structure can be formed by lowering the temperature when the pattern is subjected to the RIE process and under the condition in which the selective ratio of the mask material to the pattern material is small.

Figure 9B:
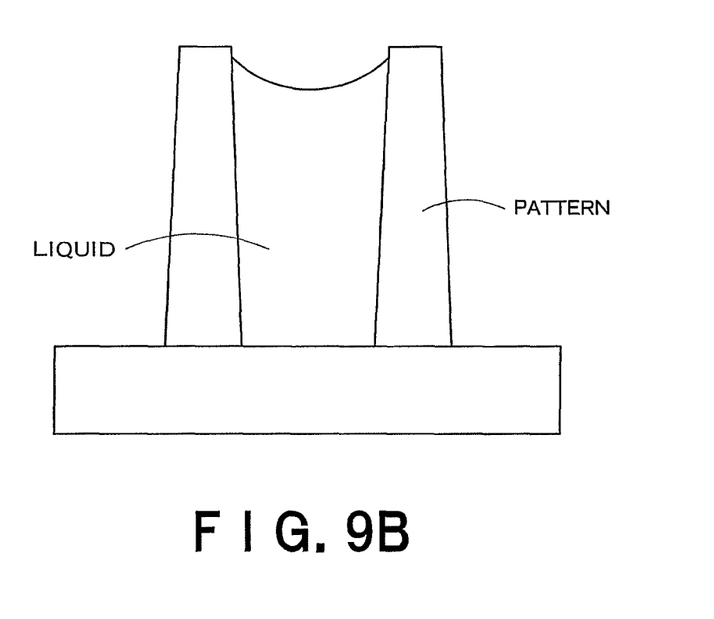

In addition, as shown in FIG. 9B, the structure in which the entire pattern is inclined, the same effect can be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor substrate surface treatment method comprising:
supplying a resist-insoluble first chemical solution onto a semiconductor substrate having a first pattern covered by a resist and a second pattern not covered by the resist to subject the second pattern to a chemical solution process;
supplying a mixed liquid of a water repellency agent and a resist-soluble second chemical solution onto the semiconductor substrate after the supply of the first chemical solution, to form a water-repellent protective film on a surface of at least the second pattern and to release the resist;
rinsing the semiconductor substrate using water after the formation of the water-repellent protective film; and
drying the rinsed semiconductor substrate.

2. The semiconductor substrate surface treatment method according to claim 1, wherein the second pattern includes a spacer film formed on side surfaces of a core, and the core is removed by the chemical solution process with the supply of the first chemical solution.

3. The semiconductor substrate surface treatment method according to claim 2, wherein:
the spacer film is formed so as to cover an upper surface and the side surfaces of the core; and
the spacer film is removed by dry etching until the upper surface of the core is exposed to form the second pattern.

4. The semiconductor substrate surface treatment method according to claim 3, wherein the first pattern and the second pattern have a line and space pattern, and the second pattern has a smaller pitch than the first pattern.

5. The semiconductor substrate surface treatment method according to claim 4, wherein the second pattern is formed in a memory cell section of the semiconductor substrate, and the first pattern is formed in a peripheral circuit section of the semiconductor substrate.

6. The semiconductor substrate surface treatment method according to claim 2, wherein an aspect ratio of the spacer film after the removal of the core is 8 or more.

7. The semiconductor substrate surface treatment method according to claim 1, wherein the first pattern and the second pattern are formed by an RIE (Reactive Ion Etching) method.

8. The semiconductor substrate surface treatment method according to claim 7, wherein processing residuals in the RIE are removed by the chemical solution process with the supply of the first chemical solution.

9. The semiconductor substrate surface treatment method according to claim 1, wherein the water repellency agent is a silane coupling agent, and the second chemical solution is thinner.

10. The semiconductor substrate surface treatment method according to claim 1, wherein:
at least part of the second pattern is formed of a film including silicon; and
after the supply of the first chemical solution and before the supply of the mixed liquid, the surface of the second pattern is oxidized using a third chemical solution which is resist-insoluble or has low resist insolubility.

11. The semiconductor substrate surface treatment method according to claim 1, wherein:
at least part of the second pattern is formed of a film including silicon; and
the surface of the second pattern is oxidized by the chemical solution process with the supply of the first chemical solution.

12. The semiconductor substrate surface treatment method according to claim 1, wherein after the supply of the first chemical solution and before the supply of the mixed liquid, as well as after the supply of the mixed liquid and before rinsing using the water, the semiconductor substrate is rinsed using alcohol.

13. The semiconductor substrate surface treatment method according to claim 12, wherein after the chemical solution process is performed and before the semiconductor substrate is rinsed using the alcohol, the semiconductor substrate is rinsed using water.

14. The semiconductor substrate surface treatment method according to claim 1, wherein after the drying of the semiconductor substrate, the second pattern is left to remove the water-repellent protective film.

15. The semiconductor substrate surface treatment method according to claim 14, wherein ultraviolet light is emitted onto the semiconductor substrate to remove the water-repellent protective film.

16. The semiconductor substrate surface treatment method according to claim 1, wherein before the chemical solution process is performed, the semiconductor substrate is held by a substrate holding and rotating unit of a substrate processing apparatus having the substrate holding and rotating unit which can hold and rotate the substrate and a nozzle above the substrate holding and rotating unit to perform surface treatment of the semiconductor substrate in the state that the semiconductor substrate is held by the substrate holding and rotating unit of the substrate processing apparatus.

17. The semiconductor substrate surface treatment method according to claim 16, wherein the first chemical solution is discharged from the nozzle to near a center of the semiconductor substrate rotated by the substrate holding and rotating unit to perform the chemical solution process.

18. The semiconductor substrate surface treatment method according to claim 16, wherein the mixed liquid is discharged from the nozzle to near a center of the semiconductor substrate rotated by the substrate holding and rotating unit to form the water-repellent protective film and to release the resist.

19. The semiconductor substrate surface treatment method according to claim 16, wherein the water is discharged from the nozzle to near a center of the semiconductor substrate rotated by the substrate holding and rotating unit to rinse the semiconductor substrate.

20. The semiconductor substrate surface treatment method according to claim 16, wherein the semiconductor substrate is rotated by the substrate holding and rotating unit to shake off the water left on a surface of the semiconductor substrate to dry the semiconductor substrate.

* * * * *